United States Patent [19]
Ishida et al.

[11] Patent Number: 6,102,629
[45] Date of Patent: Aug. 15, 2000

[54] APPARATUS FOR CONVEYING SPHERICAL ARTICLES BETWEEN ATMOSPHERES

[75] Inventors: Migaku Ishida; Katsumi Amano; Akikazu Higuchi; Shuho Kai, all of Fukuoka, Japan

[73] Assignee: Mitsui High-tec Inc., Fukuoka, Japan

[21] Appl. No.: 09/098,499

[22] Filed: Jun. 17, 1998

[30] Foreign Application Priority Data

| Jun. 19, 1997 | [JP] | Japan | 9-162711 |
| Sep. 2, 1997 | [JP] | Japan | 9-237466 |
| Oct. 21, 1997 | [JP] | Japan | 9-288724 |

[51] Int. Cl.[7] .......................... B65G 51/16; B65G 53/08; B65G 53/60
[52] U.S. Cl. ................ 406/52; 406/19; 406/64; 406/68; 406/169
[58] Field of Search ................ 406/52, 19, 64, 406/68, 169

[56] References Cited

U.S. PATENT DOCUMENTS

| 3,907,373 | 9/1975 | Jansen et al. ...................... 302/14 X |
| 4,226,208 | 10/1980 | Nishida et al. ..................... 118/706 X |
| 4,430,150 | 2/1984 | Levine et al. ...................... 156/616 X |
| 4,481,019 | 11/1984 | Moreno ................................ 55/96 X |
| 4,703,868 | 11/1987 | Shaw ................................ 221/211 X |
| 5,044,837 | 9/1991 | Schmidt ................................ 406/85 |
| 5,112,185 | 5/1992 | Koike ................................ 414/786 |
| 5,278,097 | 1/1994 | Hotchkiss et al. .................. 437/164 X |
| 5,738,771 | 4/1998 | Yoshida .............................. 204/298.24 |

FOREIGN PATENT DOCUMENTS

| 1122822 | 4/1966 | United Kingdom ................... 406/169 |

OTHER PUBLICATIONS

U.S. application No. 09/095,841, Amano, filed Jun. 1998.
U.S. application No. 09/102,678, Sakai, filed Jun. 1998.
U.S. application No. 09/112,382, Sakai, filed Jun. 1998.

*Primary Examiner*—Christopher P. Ellis
*Assistant Examiner*—Kenneth W Bower
*Attorney, Agent, or Firm*—Greenblum & Bernstein, P.L.C.

[57] ABSTRACT

The present invention relates to a device for conveying spherical articles at high speed between sequential processes having different protective atmospheres, where the leakage of the atmospheres, which must be converted between the sequential processes, is prevented. The device includes a structure incorporating a rotary relay having a plurality of spherical-article accommodating chambers formed at predetermined intervals, a support container closely mounted on the rotary relay, and having a spherical-article receiving passage and a discharge passage. An atmosphere discharge pipe communicates with the spherical-article accommodating chambers of the rotary relay, and an atmosphere supply pipe is disposed adjacent to the spherical-article discharge portion of the rotary relay and communicates with the accommodating chambers.

20 Claims, 10 Drawing Sheets

FIG. 9(a)
FIG. 9(b)
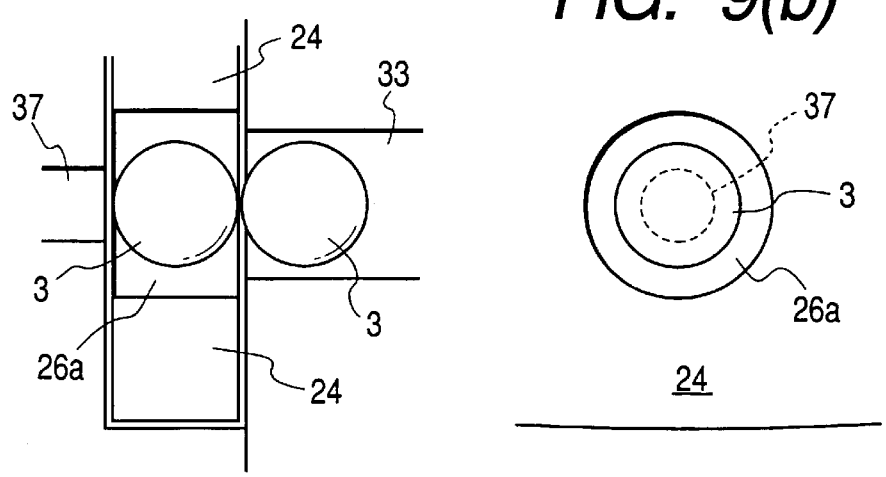
FIG. 10
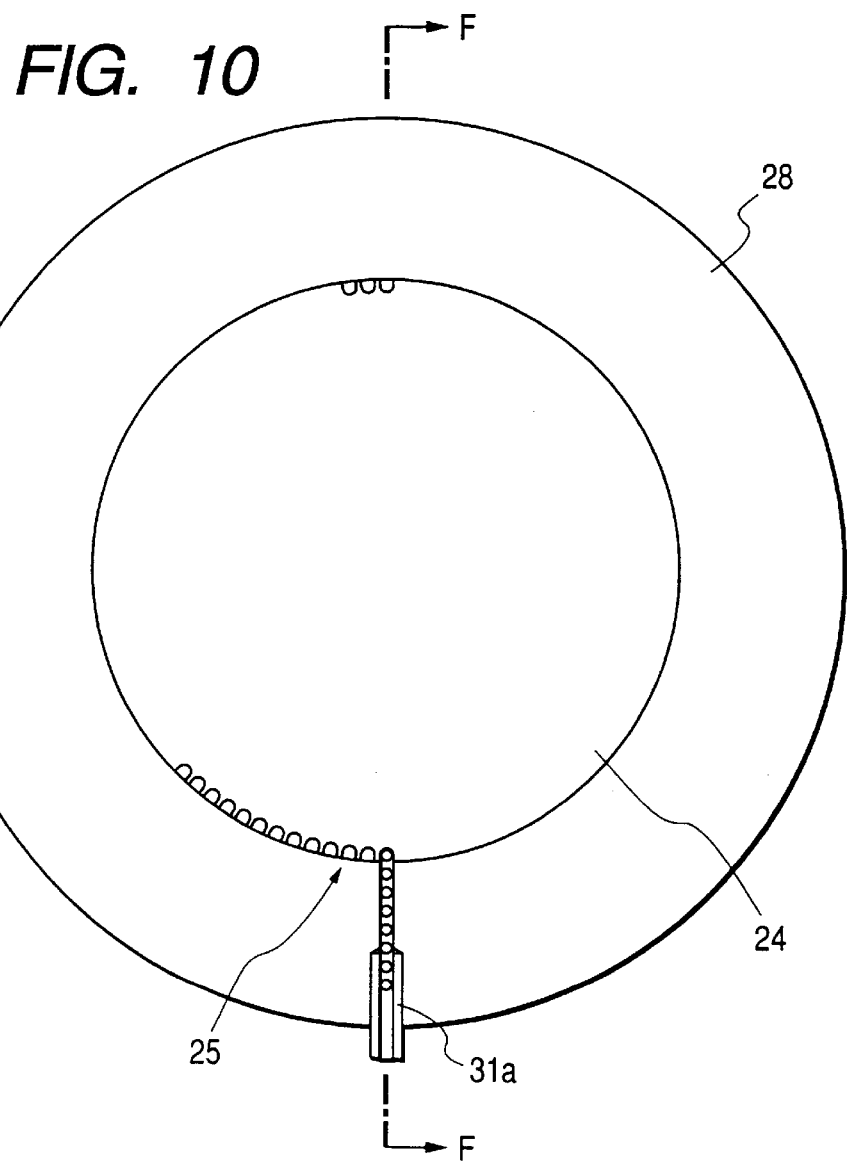

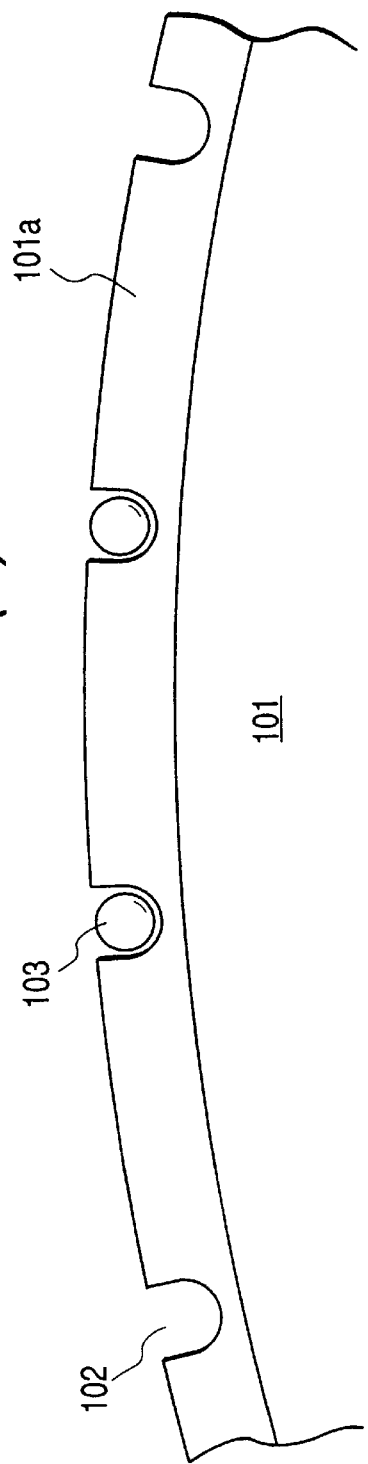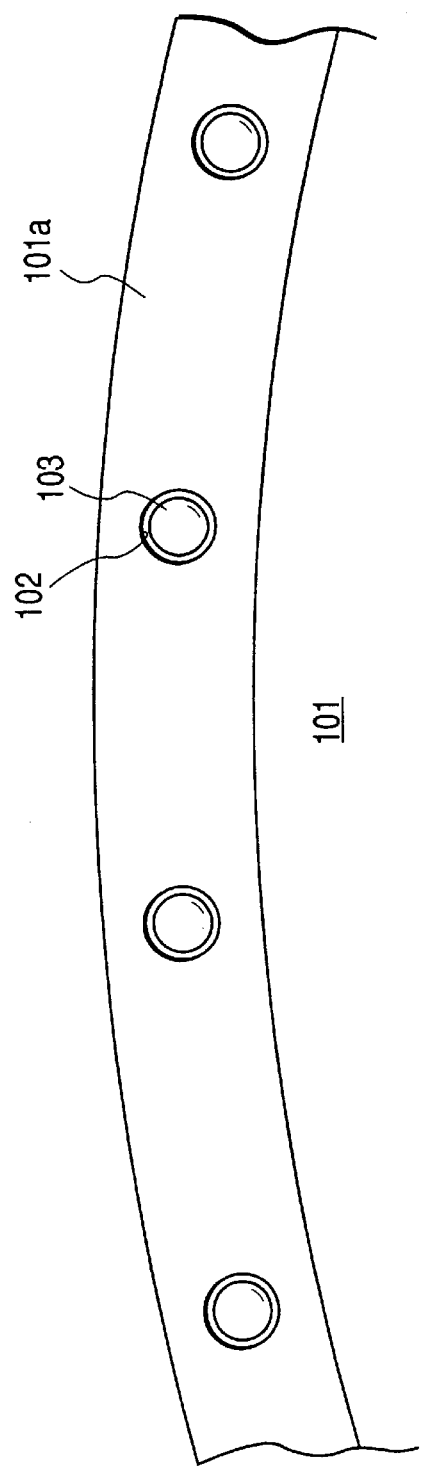

APPARATUS FOR CONVEYING SPHERICAL ARTICLES BETWEEN ATMOSPHERES

BACKGROUND OF THE INVENTION

1. Field of the Invention

The present invention relates to an apparatus for conveying spherical articles, and more particularly to an apparatus for supplying spherical articles, such as spherical and single crystal silicon articles, and an apparatus for converting the atmosphere through which the spherical articles are conveyed.

2. Description of the Related Art

Hitherto, semiconductor apparatuses have been manufactured by a method having the steps of forming a circuit pattern on a silicon wafer and dicing the silicon wafer as required so that semiconductor chips are formed. Under the above-mentioned circumstance, a technology has been suggested with which a circuit pattern is formed on a spherical semiconductor (a ball semiconductor) made of single crystal silicon.

When, for example, spherical single crystal silicon is employed to form discrete devices, such as solar cells or optical sensors, or semiconductor integrated circuits, a variety of processes must be performed which consist of processes for mirror-polishing and cleaning the spherical single crystal silicon, a process for forming a thin film, a process for coating resist, a photolithography process, an etching process and the like. In order to efficiently manufacture the spherical semiconductor devices, the various processes and conveying processes must be connected to one another so as to form a system line.

In the above-mentioned manufacturing system line, irregular supply of the spherical silicon from the previous process to a next process causes the quantity of the spherical silicon supplied to the next process to undesirably be changed. Thus, the processing condition in the next process must be changed. As a result, the processes cannot efficiently be performed. Therefore, the spherical articles, made of spherical single crystal silicon or the like, must sequentially and periodically be supplied to the next process at predetermined intervals. The surface of silicon can easily be oxidized. When a natural oxide film has been formed on the surface of the silicon, there arises another problem in that a metal electrode layer which will be formed on the natural oxide film suffers from unsatisfactory contact with the oxidized surface of the silicon. Therefore, it is preferable that the conveyance and processes are performed in a closed space which does not come in contact with the outside air.

In addition to gases, such as active gases and inert gases, each process is performed in a variety of atmospheres including fluids such as water and various solutions. When the processes are connected to one another to form a manufacturing line, introduction of the atmosphere for conveying spherical articles from the previous process into the following process must be prevented. That is, removal of the atmosphere of the previous process from the spherical articles is required between the processes. Then, the atmosphere must be converted into an atmosphere suitable for the following process when the spherical articles are conveyed. Moreover, the above-mentioned process requires high speed and satisfactory reliability to improve the productivity and the quality.

SUMMARY OF THE INVENTION

An object of the present invention is to provide a conveying apparatus which is capable of solving the above-mentioned problems and supplying, without a complicated mechanism, spherical articles made of silicon or the like, at predetermined intervals, periodically, and preferably at high speed.

Another object of the present invention is to provide an apparatus for conveying spherical articles which is capable of preventing the atmosphere of a process from leaking into the atmosphere of next process between sequential processes during conveyance of spherical articles at high speed. In particular, an object of the present invention is to quickly and reliably perform a semiconductor process, such as a film forming process or an etching process of spherical and single crystal silicon or the like.

To achieve the above-mentioned objects, an apparatus for conveying spherical articles according to the present invention comprises: a rotary relay having a plurality of spherical-article accommodating chambers formed at predetermined intervals; and a support container arranged to support the rotary relay and having a spherical-article receiving passage allowed to communicate with the accommodating chambers and a discharge passage.

It is preferable that the apparatus for conveying spherical articles according the present invention comprises: a suction passage allowed to communicate with the accommodating chamber; a vacuum suction unit for sucking the atmosphere through the suction passage; a fluid discharge passage allowed to communicate with the accommodating chamber; and a fluid supply unit for supplying fluid under pressure into the fluid discharge passage.

It is furthermore preferable that a structure is employed which comprises an acceleration pipe connected to the discharge passage; a branched pipe branched from the acceleration pipe; and a fluid supply unit for introducing fluid under pressure into the branched pipe, wherein an accelerating unit is provided which furthermore accelerates spherical articles by the fluid under pressure jetted into the acceleration pipe through the branched pipe.

To achieve the above-mentioned objects, an apparatus for conveying spherical articles according to the present invention comprises: a rotative rotary relay having a plurality of spherical article accommodating chambers formed on the same circumference at predetermined intervals, a support container mounted in close contact with the rotary relay and having a spherical article receiving passage and a discharge passage an atmosphere discharge pipe disposed in such a manner as to communicate with the spherical article accommodating chamber of the rotary relay; and an atmosphere supply pipe disposed on a spherical article discharge side of the rotary relay in such a manner as to communicate with the accommodating chamber.

The apparatus for conveying spherical articles according to the present invention and having the above-mentioned structure may have a structure that the spherical-article receiving passage and the discharge passage are provided with position detection means, such as optical sensors exemplified by optical fiber sensors, ultrasonic sensors or vibration detection sensors.

As a result, the position of the spherical article which must be processed can reliably be recognized. Thus, the spherical articles can reliably be conveyed one by one. Thus, a line free from clogging during the conveyance can be formed.

A trouble produced during conveyance can immediately be detected. Even if the line is stopped, any defect is not caused in each process. If a defect is caused in any process, the spherical articles are not conveyed to a next process.

Moreover, serial numbers can be given to the spherical articles so that a further reliable process control is permitted.

A structure may be employed in which the atmosphere discharge pipe and the atmosphere supply pipe are provided with opening/closing valves, such as solenoid valves for controlling passage of the atmosphere gas and control means is provided for controlling opening/closing valve of the opening/closing valve valves in response to position confirmation signals transmitted from the position detection means.

In this case, the flow rate of the atmosphere can be minimized by controlling the operations of the opening/closing valves. As a result, energy and resources can be saved and the cost can be reduced.

Moreover, a characteristic for sealing the atmosphere among the processes can be improved.

An apparatus for conveying spherical articles according to the present invention having the above-mentioned structure may have a structure that the rotary relay has an annular portion, and the accommodating chamber has an accommodating portion formed in the outer periphery of the annular portion in such a manner as to be enabled to communicate with the receiving passage and the discharge passage of the support container and as to have a diameter larger than that of the spherical article and a through groove portion allowed to communicate with the accommodating portion, disposed in a direction of a normal line of the annular portion and having a small diameter.

In this case, the atmosphere can furthermore smoothly be supplied/discharged to and from the accommodating portions for accommodating the spherical articles. Moreover, the size of the apparatus can be reduced and a multiplicity of uniform passage can be formed.

The through groove portion may be formed in such a manner as to be enabled to communicate with the atmosphere discharge pipe and the atmosphere supply pipe on the inner surface of the annular portion.

The foregoing structure enables discharge to be performed on the outer surface of the annular member to the inner surface of the receiving portion. Therefore, supply and discharge can efficiently be performed.

The receiving passage and the atmosphere discharge pipe are formed in such a manner as to be able to face each other through said through groove portion and to be on a same normal line.

Since the above-mentioned structure causes the atmospheres to flow on one straight line, discharge of the atmospheres can efficiently be performed.

The the discharge passage and the atmosphere supply pipe are formed in such a manner as to be able to face each other through said through groove portion and to be on a same normal line.

Since the above-mentioned structure causes the atmosphere to flow on one straight line, discharge of the spherical articles can efficiently be performed.

A structure may be employed in which the receiving passage of the support container is structure in such a manner as to be closed by a next spherical article at the instant when one of the spherical articles is supplied to the accommodating portion, the atmosphere discharge pipe is allowed to communicate with the through groove portion at the same instant so as to discharge the atmosphere in the through groove portion, and the pressure in the accommodating portion is instantaneously made to be a negative pressure.

The above-mentioned structure does not require a discharge pump for realizing negative pressure to sequentially discharge and supply the atmospheres.

A structure may be employed which further comprises: a second atmosphere converting portion formed between the receiving passage and the discharge passage of the support container, wherein the second atmosphere converting portion has a second atmosphere discharge pipe and a second atmosphere supply pipe each of which is formed along the surface of the annular member.

The above-mentioned structure enables the atmosphere to be substituted on the conveyance passage. When a gas to be used in the following process is supplied to the second atmosphere supply pipe, substitution of purer atmosphere is permitted. When an inert gas, the temperature of which has been controlled to a required level, is supplied to the second atmosphere supply pipe, an annealing process can be completed during the conveyance.

A structure may be employed in which when the atmosphere supply pipe has been allowed to communicate with the through groove portion and thus the atmosphere has been supplied into the through groove portion, the pressure in the accommodating portion is instantaneously made to be a negative pressure, causing discharge to the discharge passage to be performed by the atmospheric pressure from the through groove portion.

The foregoing structure enables the atmospheres to sequentially be discharged and supplied without a necessity of providing a discharge pump for realizing a negative pressure.

At least one pair of a gas supply pipe and a gas discharge pipe may be disposed between the receiving passage and the discharge passage in such a manner as to be enabled to communicate with the accommodating portion.

When the inert gas is supplied to the foregoing gas supply pipe, the inert gas is substituted for the atmosphere of the previous process after the accommodating portion has been brought to the position of the gas supply pipe during the conveyance and thus communication has been established. As a result, the atmosphere of the previous process can furthermore reliably be removed.

When an inert gas, the temperature of which has been controlled to a required temperature, is supplied to the gas supply pipe, spherical articles made of spherical and single crystal silicon or the like can quickly be introduced to a portion having a required temperature. Therefore, high-temperature annealing or the like can significantly easily be performed.

When a reactive gas, the temperature of which has been controlled to a required level, is supplied to the gas supply pipe, spherical articles made of spherical and single crystal silicon or the like in the accommodating chamber can efficiently be subjected to a film forming process or an etching process with a small quantity of the gas.

The apparatus may have two or more pairs of the gas supply pipe and the gas discharge pipe, and the gas which is supplied to each gas supply pipe is controlled to have different temperatures. As a result of the above-mentioned structure, a process for, for example, oxidizing the surface of spherical articles made of spherical and single crystal silicon or the like, can be performed in such a manner that the oxidizing temperature is controlled to two steps of temperature levels so as to form films having different compositions. Moreover, an oxide film and a nitride film can sequentially be formed by switching the composition of the gas to be supplied from an oxidizing gas to a gas containing nitrogen.

A structure may be employed in which the apparatus has a first gas supply pipe and a first gas discharge pipe disposed upstream and a second gas supply pipe and a second gas discharge pipe disposed downstream, the first gas supply pipe is supplied with a gas containing nitrogen and controlled to a nitriding temperature, the second gas supply pipe is supplied with a gas, the temperature of which is room temperature, and when the accommodating chamber is at the position of the first gas supply pipe, the accommodating chamber serves as a nitriding chamber for performing nitrogen annealing, and when the accommodating chamber is at the second gas supply pipe, the accommodating chamber serves as a temperature adjusting chamber.

As a result of the above-mentioned structure, the nitriding process can significantly easily be performed with satisfactory workability during a conveyance process from a previous process to a next process.

The apparatus may have two or more pairs of the gas supply pipe and the gas discharge pipe, and the gases which are supplied to the gas supply pipes may be gases having different compositions.

A first reactive gas, the temperature of which has been controlled to a required level, is, in the first gas supply pipe, supplied to spherical and single crystal silicon in the accommodating chamber so as to form a first film. Moreover, a second reactive gas, the temperature of which has been controlled to a required level, is supplied to the second gas supply pipe to form a second film on the spherical and single crystal silicon in the accommodating chamber. Thus, a so-called superlattice structure in which a variety of a very thin films, the thickness of which is about one atom, that is, a so-called super-thin films, are laminated can easily be formed.

When a gas or fluid is supplied from each supply pipe by rotating the rotary relay plural times before the spherical articles are discharged to the discharge passage, a plurality of processes of one spherical article can be completed.

In this embodiment, the "atmosphere" or the "fluid" includes liquid, such as water and variety of solutions, as well as gases, such as the active gas and the inert gas.

BRIEF DESCRIPTION OF DRAWINGS

FIG. 9(a) is an enlarged view of a portion A enclosed in a dashed-line circle shown in FIG. 8 and FIG. 9(b) is an enlarged view of a portion B enclosed in a dashed-line circle shown in FIG. 7;

FIG. 10 is a front view showing a fourth embodiment of the apparatus according to the present invention for converting the atmosphere through which spherical articles are conveyed in a state in which a cover portion has been removed;

FIGS. 14A and 14B are enlarged views of a portion A shown in FIG. 12;

DESCRIPTION OF THE PREFERRED EMBODIMENTS

Embodiments each having a structure that the present invention is applied to a process for conveying spherical single crystal silicon in a process for manufacturing semiconductor devices will now be described.

First Embodiment

Figure 1:
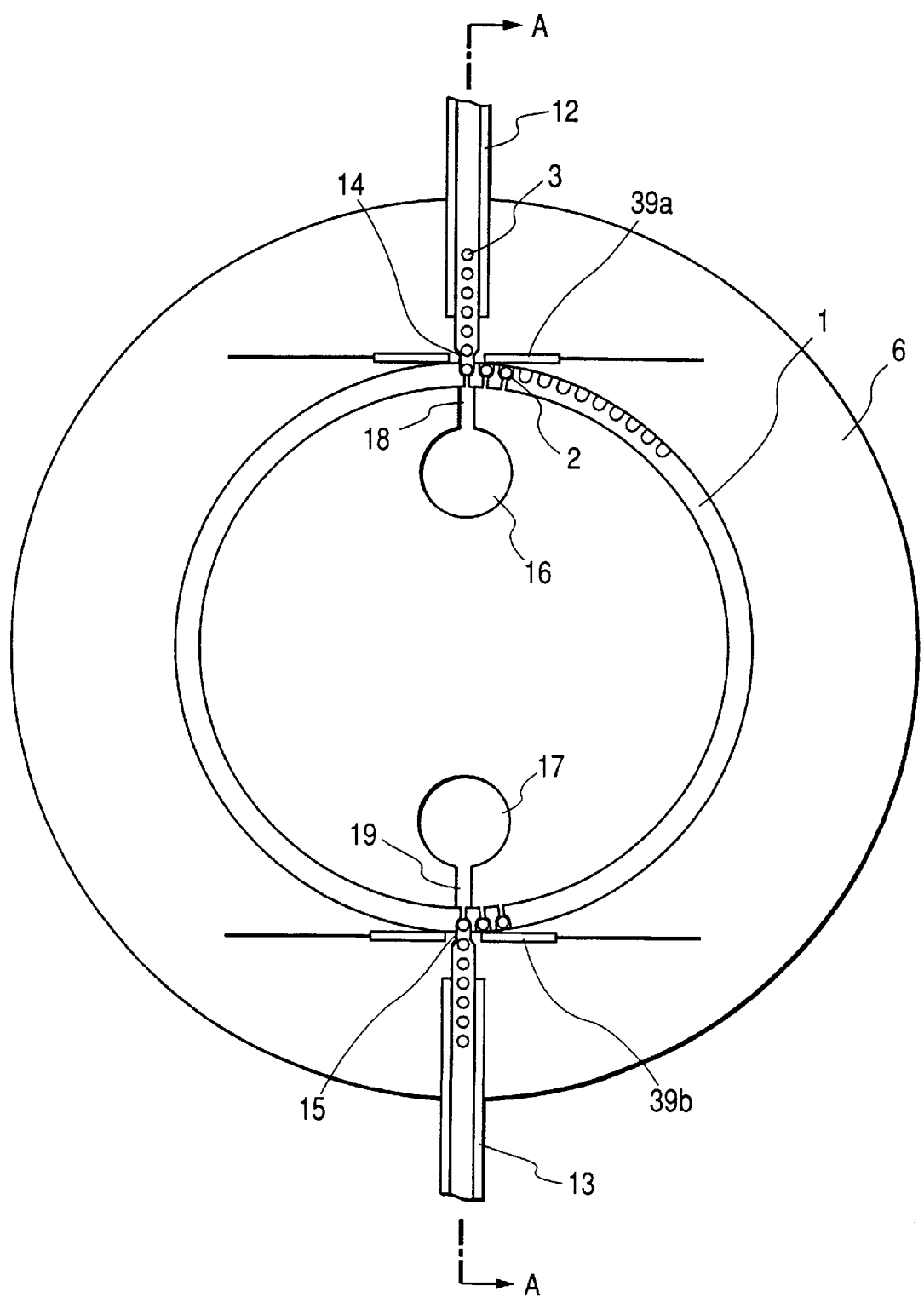
FIG. 1 is a front view showing a first embodiment of an apparatus according to the present invention for converting the atmosphere through which spherical articles are conveyed in a state in which a cover portion has been removed.
Figure 2:
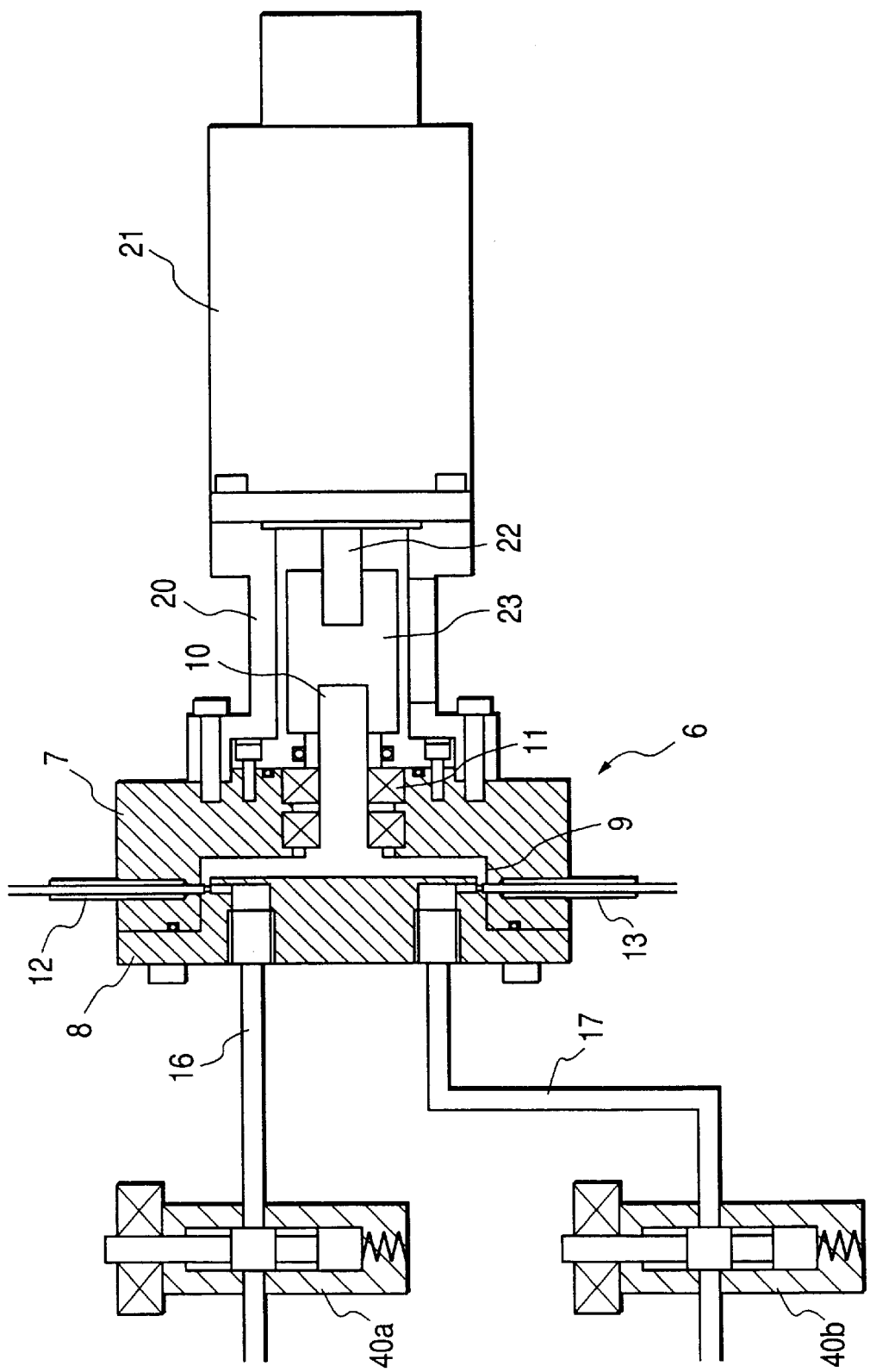
FIG. 2 is a cross sectional view taken along line A—A shown in FIG. 1.
Figure 3:
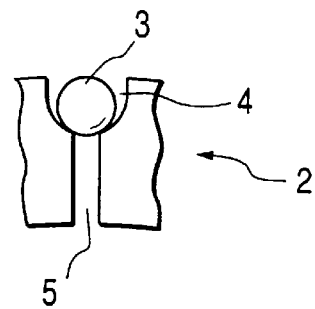
FIG. 3 is an enlarged cross sectional view showing a portion in the vicinity of an accommodating portion of the apparatus for converting the conveying atmosphere.

FIG. 1 is a front view showing a state in which a cover portion has been removed from an apparatus according to the present invention for converting the atmosphere through which spherical articles are conveyed. FIG. 2 is a cross sectional view taken along line A—A shown in FIG. 1. FIG. 3 is a cross sectional view showing a portion in the vicinity of an accommodating chamber 4 for accommodating spherical single crystal silicon articles which are spherical articles in this embodiment.

Referring to FIG. 1, reference numeral 1 represents a rotative rotation relay unit 1 formed into a disc shape. Moreover, a plurality of accommodating portions 2 for accommodating spherical single crystal silicon 3 are formed in the outer peripheral of the rotation relay unit 1 at predetermined intervals in the direction of the circumference of the rotation relay unit 1. As shown in FIG. 3, each of the accommodating portion 2 has an accommodating chamber 4 having a space which is capable of accommodating the spherical single crystal silicon 3 and an atmosphere retention passage 5 allowed to communicate with the accommodating chamber 4 and formed in a direction toward the center of rotation of the rotation relay unit 1.

As shown in FIG. 2, the rotation relay unit 1 is rotatively supported in the inside portion of a support container 6. The support container 6 has a separated structure consisting of a container portion 7 serving as a housing for the rotation relay unit 1 and a cover portion 8 serving as a cover for the container portion 7.

The container portion 7 has a recess 9 which accommodates the rotation relay unit 1 and to which the cover portion 8 is engaged. Moreover, the container portion 7 has a bearing 11 for rotatively supporting a rotational shaft 10 formed integrally with the rotation relay unit 1. A receiving passage 12 and a discharge passage 13 are formed at symmetrical positions on the outside of the container portion 7.

The receiving passage 12 is formed to supply the single crystal silicon 3 to the accommodating chamber 4 of the rotation relay unit 1. The leading end of the receiving passage 12 has a diameter similar to that of the accommodating chamber 4 and arranged to be close contact with the outer surface of the accommodating portion 2 so as to form a spherical article supply passage 14. The discharge passage 13 is formed to discharge the spherical single crystal silicon 3 from the accommodating chamber 4 of the rotation relay unit 1. The leading end of the discharge passage 13 is formed into a spherical article discharge passage 15 having a diameter similar to that of the accommodating chamber 4 and enabled to be close contact with the outer surface of the accommodating portion 2.

Referring to FIG. 1, reference numerals 39a and 39b represent position detection means disposed in the receiving passage 12 and discharge passage 13 formed in the rotation relay unit 1 at symmetrical positions, the position detection means 39a and 39b being position detection means disposed to face each other. The position detection means 39a and 39b are arranged to confirm the position of the spherical article 3 which passes through the corresponding passages.

As shown in FIG. 1, the position detection means 39a and 39b may be disposed to face a portion of the spherical article supply passage 14 of the receiving passage 12 and a portion of the spherical article discharge passage 15 of the discharge passage 13, respectively. As an alternative to this, the position detection means 39a and 39b may be located at portions of the receiving passage 12 and discharge passage 13 which extend over the support container 6. A plurality of the position detection means may be provided for each of the passages. In this case, the position of the single crystal silicon 3 can furthermore reliably be detected.

An atmosphere discharge pipe 16 and an atmosphere supply pipe 17 are disposed on the side surface of the cover portion 8. The atmosphere discharge pipe 16 is disposed at a position corresponding to the receiving passage 12. The atmosphere discharge pipe 16 has an atmosphere discharge passage 18 which is enabled to communicate with an atmosphere retention passage 5 of the accommodating portion 2 of the rotation relay unit 1. The atmosphere supply pipe 17 is disposed at a position corresponding to the discharge passage 13. The atmosphere supply pipe 17 has an atmosphere supply passage 19 which is enabled to communicate with the atmosphere retention passage 5 of the accommodating portion 2 of the rotation relay unit 1.

The atmosphere discharge pipe 16 and atmosphere supply pipe 17 are provided with corresponding opening/closing valves 40a and 40b arranged to control passage of the atmosphere gas similarly to solenoid valve. In response to position confirmation signals transmitted from the position detection means 39a and 39b, springs or the like are operated so that opening/closing of the foregoing valves is controlled.

The cover portion 8 is hermetically joined to the container portion 7. The outer surface of the rotation relay unit 1 is slidable in a state in which the outer surface is in close contact with the inner surface of the recess 9 of the container portion 7.

The support container 6 is joined to a motor 21 through a flange 20. A rotational shaft 22 of the motor 21 is connected to a rotational shaft 10 of the rotation relay unit 1 through a joint 23. The rotation relay unit 1 is rotated by the motor 21.

The operation of the conveying atmosphere converting apparatus will now be described.

The rotation relay unit 1 is rotated by the motor 21 so that a plurality of the spherical single crystal silicon spherical articles 3 are continuously supplied from the receiving passage 12. An atmosphere discharge unit (not shown) is connected to the atmosphere discharge pipe 16. The inside portion of the atmosphere discharge pipe 16 is made to be a negative pressure level. An atmosphere supply unit (not shown) is connected to the atmosphere supply pipe 17. The inside portion of the atmosphere supply pipe 17 is made to be a positive pressure level.

When the rotation relay unit 1 has been rotated and thus the position of the accommodating chamber 4 has been made coincide with the positions of the spherical article supply passage 14 and the atmosphere discharge passage 18, the atmosphere in the accommodating chamber 4 is introduced into the atmosphere discharge pipe 16 through the atmosphere retention passage 5 and the atmosphere discharge passage 18. At this time, an end of the receiving passage 12 is connected to a previous processing unit (not shown), such as a vacuum CVD apparatus, so as to receive (spherical single crystal silicon) spherical articles (works to be processed) processed in the previous process and thus having a CVD oxide film formed on the surface thereof. The works (the spherical single crystal silicon) 3 supplied from the receiving passage 12 are allowed to pass through the spherical article supply passage 14, and then accommodated in the accommodating chamber 4 of the rotation relay unit 1 in which the negative pressure has been maintained. At this time, the spherical articles 3 allowed to pass through the spherical article supply passage 14 are detected by the position detection means 39a. A position confirmation signal transmitted from the position detection means 39a is allowed to pass through a communication line (not shown) so as to be transmitted to the opening/closing valve 40a provided for the atmosphere discharge pipe 16 and arranged to act similarly to a solenoid valve.

In response to the position confirmation signal, the operation of the opening/closing valve 40a is controlled so that the atmosphere allowed to flow from the receiving passage 12 and composed of monosilane ($SiH_4$) and $N_2O$ gas or the like employed in the previous process is recovered by the atmosphere discharge pipe 16. Therefore, undesirable retention of the atmosphere of the previous process in the accommodating chamber 4 can be prevented.

After the rotation relay unit 1 has been rotated, the spherical articles 3 are moved along the circumference of the rotation relay unit 1 in a state in which the spherical articles 3 are stored in the accommodating chamber 4.

When the position of the accommodating chamber 4 has been made coincide with the positions of the spherical article discharge passage 15 and the atmosphere supply pipe 17, the atmosphere, such as the gases, which is supplied through the atmosphere supply pipe 17 and which will be used in the following process, is allowed to pass through the atmosphere supply passage 19 and the atmosphere retention passage 5. Then, the atmosphere is blown into the accommodating chamber 4. As a result, the spherical articles 3 in the accommodating chamber 4 are allowed to pass through the spherical article discharge passage 15, and then discharged to the discharge passage 13.

The atmosphere blown from the atmosphere supply passage 19 and arranged to be used in the next process is, together with the spherical articles 3, introduced into the next process. Similarly to the above-mentioned supplying operation, the spherical articles 3 are detected by the position detector 39b disposed in the spherical article discharge passage 15. In response to a position confirmation signal transmitted from the position detector 39b, the operation of the opening closing valve 40b provided for the atmosphere supply pipe 17 and arranged to act similarly to a solenoid valve is controlled. As a result, only the atmosphere which will be used in the next process is supplied to the next process. Therefore, undesirable mixture of the atmosphere of the previous process can be prevented. That is, the sealing characteristics against the atmosphere of the previous process can be improved. Experiments resulted in that the density of the atmosphere of the previous process in the discharge passage 13 was made to be 1/1000 ppm or lower when the density of the atmosphere of the previous process was 1 ppm in the receiving passage 12.

Since the multiplicity of the accommodating chambers are formed on the circumference of the rotation relay unit 1 so as to continuously supply/discharge the spherical articles while the rotation relay unit 1 was rotated, the process for converting the atmosphere can be performed at high speed, for example, about 2,500 spherical articles second. Note that the material of the rotation relay unit 1 and the support container 6 may be resin, stainless steel or a material obtained by coating stainless steel with teflon resin to be suitable for the atmosphere, for example, water and inert gases, through which spherical articles are conveyed.

Second Embodiment

Figure 4:
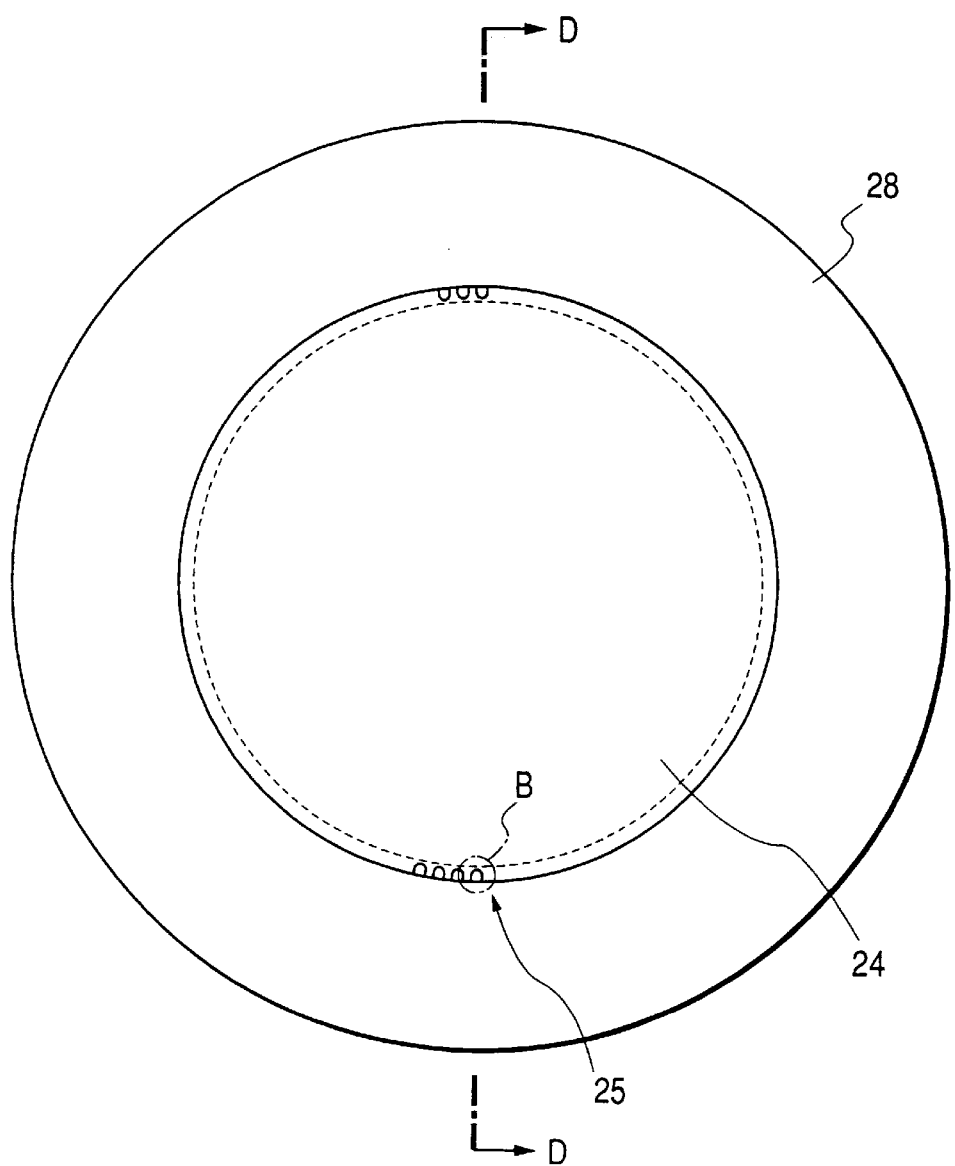
FIG. 4 is a front view showing a second embodiment of the apparatus according to the present invention fore converting the atmosphere through which spherical articles are conveyed in a state in which a cover portion has been removed.
Figure 5:
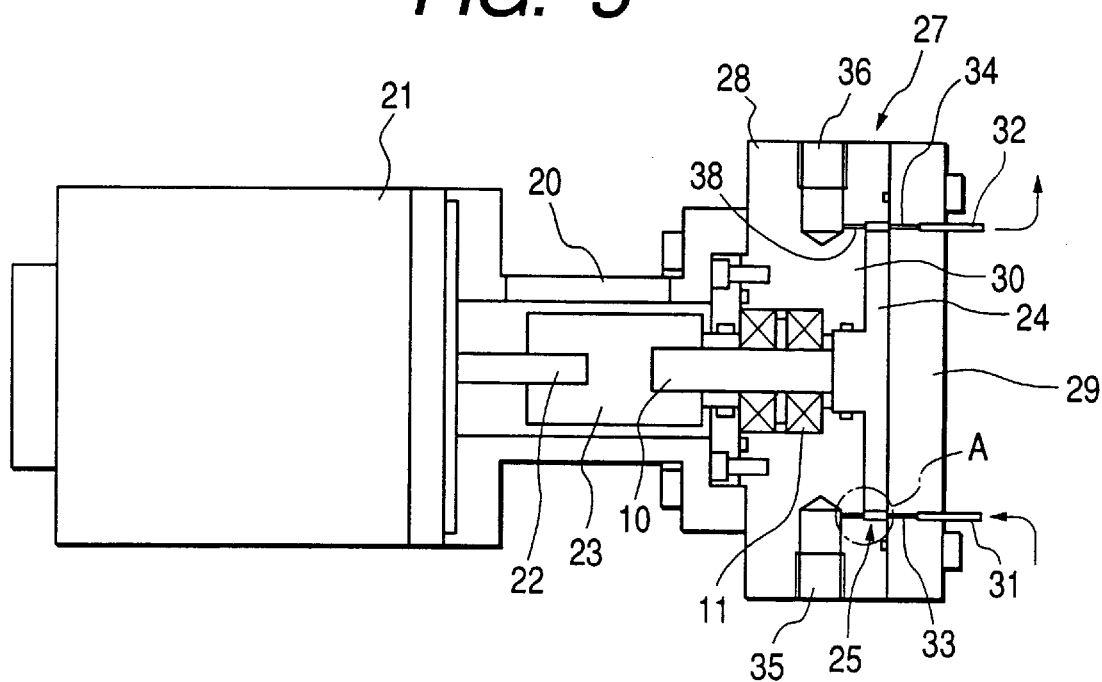
FIG. 5 is a cross sectional view taken along line D—D shown in FIG. 4.

FIG. 4 is a front view showing a second embodiment of an apparatus according to the present invention for converting the atmosphere through which spherical articles are conveyed in a state in which a cover portion has been removed. FIG. 5 is a cross sectional view taken along line D—D shown in FIG. 4.

In contrast to the first embodiment, the conveying-atmosphere converting apparatus according to the second embodiment has a structure in which an accommodating chamber 26 is exposed to the outside over the outer surface of a rotation relay 24.

Referring to FIG. 4, a plurality of accommodating portions 25 for accommodating spherical semiconductor devices, which are spherical articles, are formed on the outer periphery of a rotative rotation relay 24 formed into a disc shape, the accommodating portions 25 being formed at predetermined intervals in the circumference direction of the rotation relay 24. As shown in FIG. 6, the accommodating portion 25 has an accommodating chamber 26 including a space which is capable of accommodating the spherical article 3, the accommodating chamber 26 being exposed to the outside over the outer surface of the rotation relay 24.

Figure 6A:
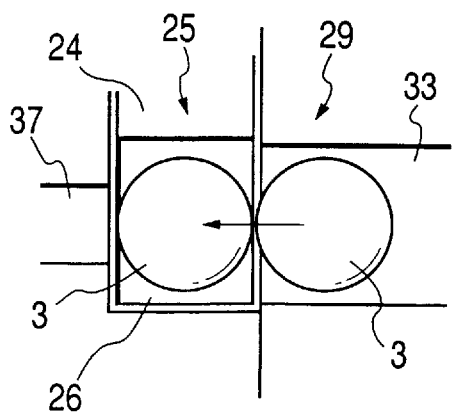
FIG. 6(a) is an enlarged view of a portion A enclosed in a dashed-line circle shown in FIG. 5
Figure 6B:
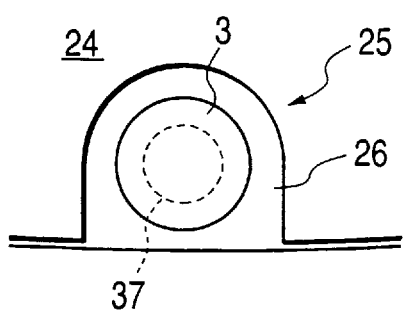
FIG. 6(b) is an enlarged view of a portion B enclosed in a dashed-line circle shown in FIG. 4.

FIG. 6(a) is an enlarged view of a portion A enclosed by a dashed-line circle shown in FIG. 5. FIG. 6(b) is an enlarged view of a portion B enclosed by a dashed-line circle shown in FIG. 4.

The rotation relay 24 is rotatively supported in a support container 27. The support container 27 has a separated structure composed of a container portion 28 serving as a housing for the rotation relay 24 and a cover portion 29 serving as a cover for the container portion 28.

The container portion 28 has a recess 30 which accommodates the rotation relay 24 and to which the cover portion 29 is engaged. The cover portion 29 is hermetically joined to the container portion 28. Since a mechanism for rotating the rotation relay 24 is structured similarly to that according to the first embodiment, the same reference numerals are given to the corresponding elements and the corresponding elements are omitted from description.

A receiving passage 31 and a discharge passage 32 penetrating the cover portion 29 are disposed at symmetrical positions on the circumference of the cover portion 29 corresponding to the accommodating portion 25 of the rotation relay 24. The receiving passage 31 is a passage for supplying spherical articles 3 to the accommodating chamber 26 of the rotation relay 24. The leading end of the receiving passage 31 is formed into a spherical article supply passage 33 which has a diameter similar to that of the accommodating chamber 26 and which can be brought into close contact with the outer surface of the accommodating portion 25. The discharge passage 32 is a passage for discharging the spherical articles 3 from the accommodating chamber 26 of the rotation relay 24. The leading end of the discharge passage 32 is formed into a spherical article discharge passage 34 which has a diameter similar to that of the accommodating chamber 26 and which can be brought into close contact with the outer surface of the accommodating portion 25.

An atmosphere discharge pipe 35 and an atmosphere supply pipe 36 are disposed on the outer surface of the container portion 28. The atmosphere discharge pipe 35 is disposed at a position corresponding to the receiving passage 31. The atmosphere discharge pipe 35 has an atmosphere discharge passage 37 which can be allowed to communicate with the accommodating portion 25 of the rotation relay 24. The atmosphere supply pipe 36 is disposed at a position corresponding to the discharge passage 32. The atmosphere supply pipe 36 has an atmosphere supply passage 38 which can be allowed to communicate with the accommodating portion 25 of the rotation relay 24.

The rotation relay 24 is rotated by the motor 21. A plurality of the spherical articles 3 are continuously supplied through the receiving passage 31. An atmosphere discharge unit (not shown) is, through the opening/closing valve, connected to the atmosphere discharge pipe 35. The inside portion of the atmosphere discharge pipe 35 is made to be negative pressure. An atmosphere supply (not shown) is, through the opening/closing valve, connected to the atmosphere supply pipe 36. The inside portion of the atmosphere supply pipe 36 is made to be positive pressure.

When the rotation relay 24 has been rotated and thus the position of the accommodating chamber 26 has been made coincide with the positions of the spherical article supply passage 33 of the receiving passage 31 and the atmosphere discharge passage 37, the inside atmosphere of the accommodating chamber 26 is allowed to pass through the atmosphere discharge passage 37. Then, the inside atmosphere is attracted toward the atmosphere discharge pipe 35. As a result, the spherical articles 3 supplied through the receiving passage 31 are allowed to pass through the spherical article supply passage 33, and then accommodated in the accommodating chamber 26 of the rotation relay 24. Thus, each of the spherical articles 3 is held in the accommodating chamber 26 by dint of the negative pressure.

At this time, the atmosphere, such as gases employed in the previous process and introduced from the receiving passage 31, is recovered by the atmosphere discharge pipe 35. Therefore, retention of the atmosphere of the previous process in the accommodating chamber 26 can be prevented.

When the rotation relay 24 has been rotated, the spherical articles 3 are moved along the circumference of the rotation relay 24 in a state in which each of the spherical articles 3 is held in the accommodating chamber 26. When the position of the accommodating chamber 26 has been made coincide with the position of the spherical article discharge passage 34 of the discharge passage 32 and the atmosphere supply pipe 36, the atmosphere, such as the gas which is supplied through the atmosphere supply pipe 36 and which will be used in a next process, is allowed to pass through the atmosphere supply passage 38. Then, the atmosphere is blown into the accommodating chamber 26. As a result, the spherical article 3 in the accommodating chamber 26 is allowed to pass through the spherical article discharge passage 34, and then extruded into the spherical article discharge passage 34. Then, the spherical article 3 is introduced into the discharge passage 32.

Third Embodiment

Figure 7:
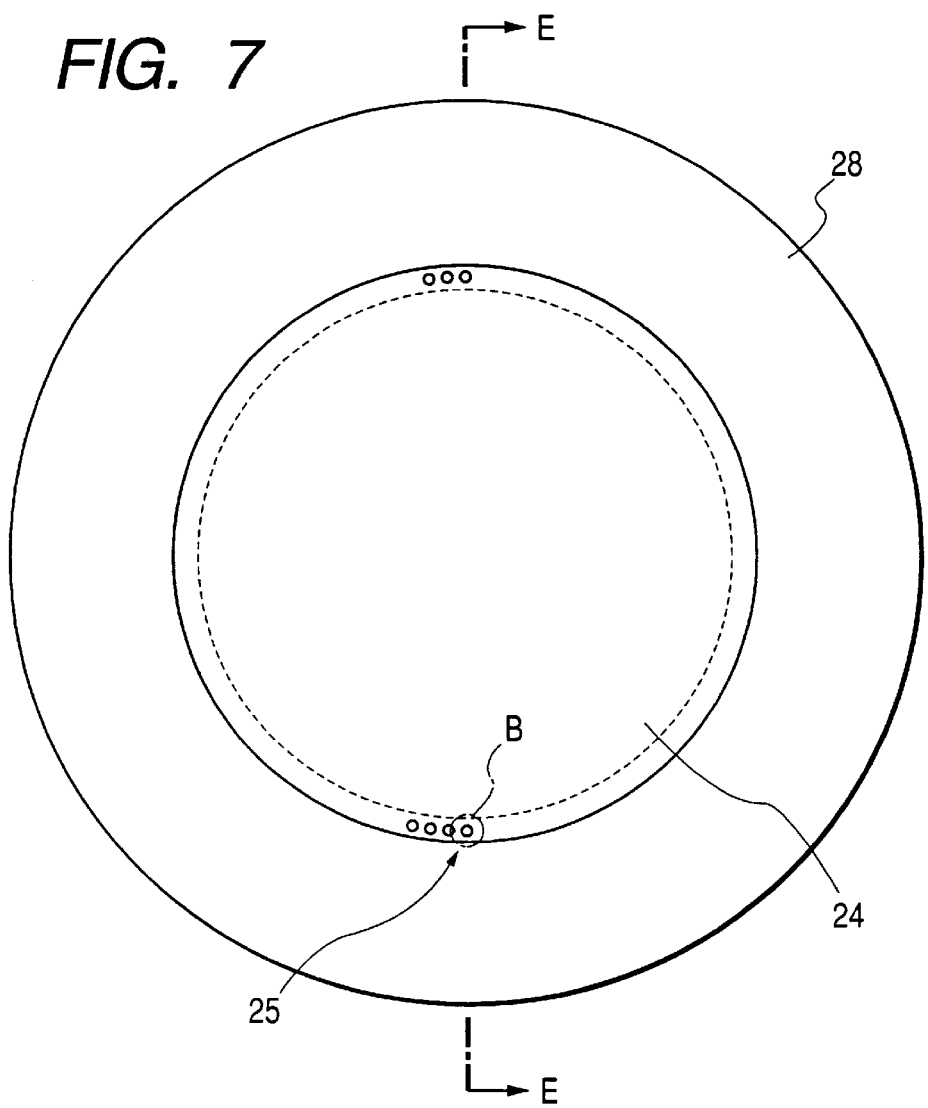
FIG. 7 is a front view showing a third embodiment of the apparatus according to the present invention for converting the atmosphere through which spherical articles are conveyed in a state in which a cover portion has been removed.
Figure 8:
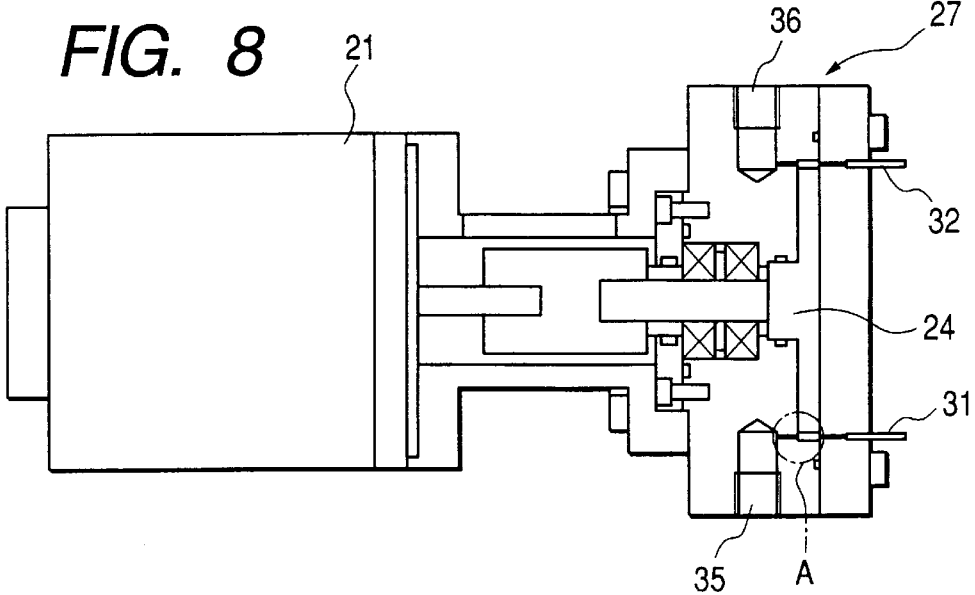
FIG. 8 is a cross sectional view taken along line E—E shown in FIG. 7.

FIG. 7 is a front view showing a third embodiment of the present invention in a state in which the cover has been removed. FIG. 8 is a cross sectional view taken along line E—E shown in FIG. 7. FIG. 9(a) is an enlarged view of a portion A enclosed in a dashed-line circle shown in FIG. 8. FIG. 9(b) is an enlarged view of a portion B enclosed in a dashed-line circle shown in FIG. 7. Elements corresponding to those according to the second embodiment are given the same reference numerals.

The third embodiment has a structure similar to that according to the second embodiment. In contrast to the second embodiment having the accommodating chamber 26 which is disposed to be exposed to the outside over the outer surface of the rotation relay 24, the third embodiment has a characteristic that the circular-recess-shape accommodating chamber 26a is formed at a position somewhat inwards deviated from the outer surface of the rotation relay 24.

Fourth Embodiment

Figure 11:
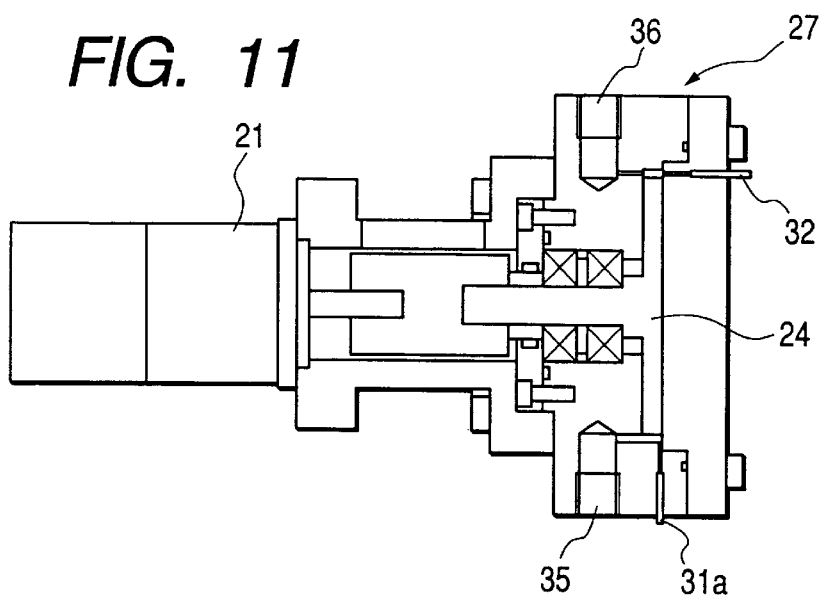
FIG. 11 is a cross sectional view taken along line F—F show in FIG. 10.

FIG. 10 is a front view showing a fourth embodiment of an apparatus according to the present invention for converting the atmosphere through which spherical articles are conveyed in a state in which the cover portion has been removed. FIG. 11 is a cross sectional view taken along line F—F shown in FIG. 10. Note that elements corresponding to those according to the second embodiment have the same reference numerals.

In contrast to the second embodiment in which the receiving passage 31 is disposed vertically with respect to the surface of rotation of the rotation relay 24, the fourth embodiment is different from the second embodiment in that the receiving passage 31a is disposed in parallel to the surface of rotation of the rotation relay 24.

Although the illustration is omitted in each of the drawings showing the second to fourth embodiments, the receiving passage 31 and the discharge passage 32 may be provided with position detection means arranged similarly to those according to the first embodiment. Moreover, an opening/closing valve, such as a solenoid valve, for controlling passage of each atmosphere may be disposed on an extension from each of the atmosphere discharge pipe 35 and the atmosphere supply pipe 36. Thus, the opening/closing operation of the opening/closings valve may be controlled in response to position confirmation signals supplied from the position detection means.

Fifth Embodiment

Figure 12:
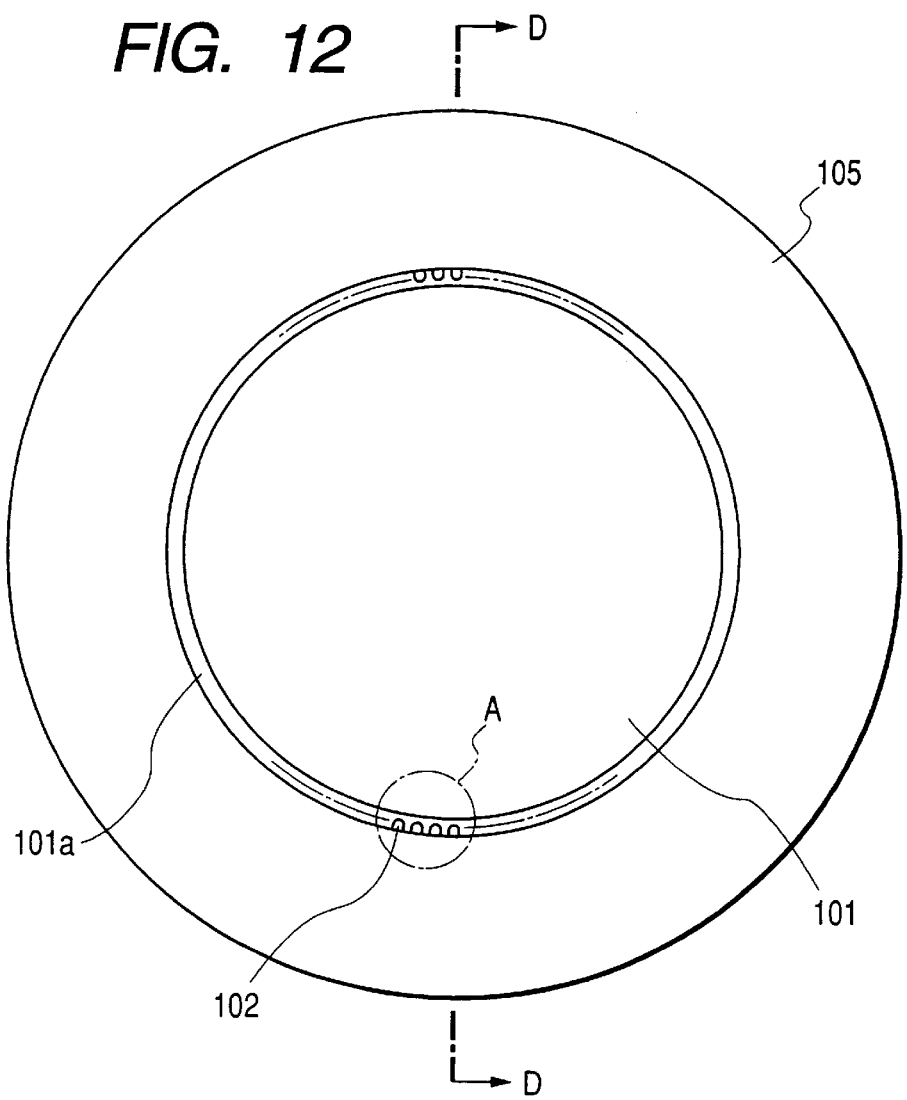
FIG. 12 is a front view showing a supply unit (a pace maker) according to a fifth embodiment of the present invention in a state in which the cover portion has been removed.
Figure 13:
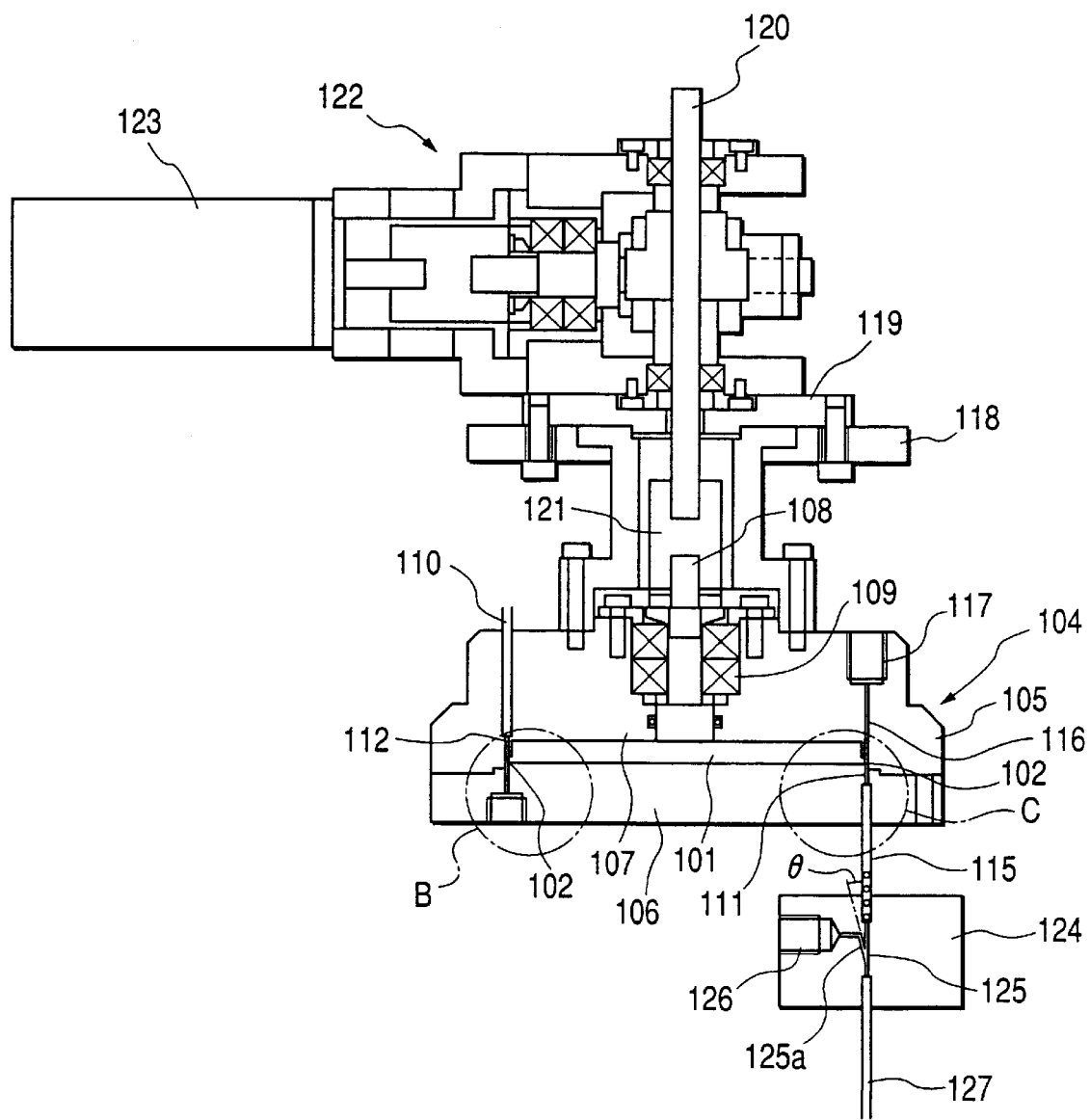
FIG. 13 is a cross sectional view taken alone line D—D shown in FIG. 12.
Figure 15:
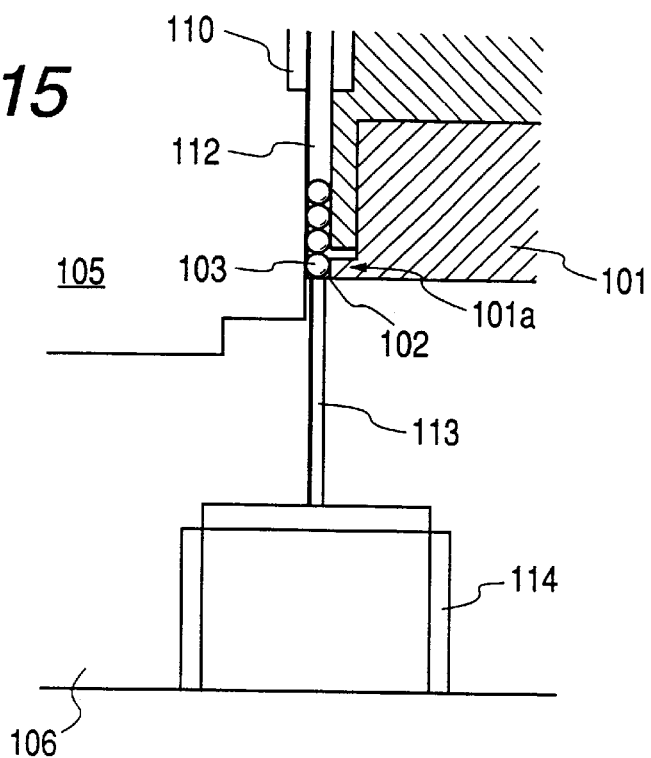
FIG. 15 is an enlarged cross sectional view of a portion B shown in FIG, 13.
Figure 16:
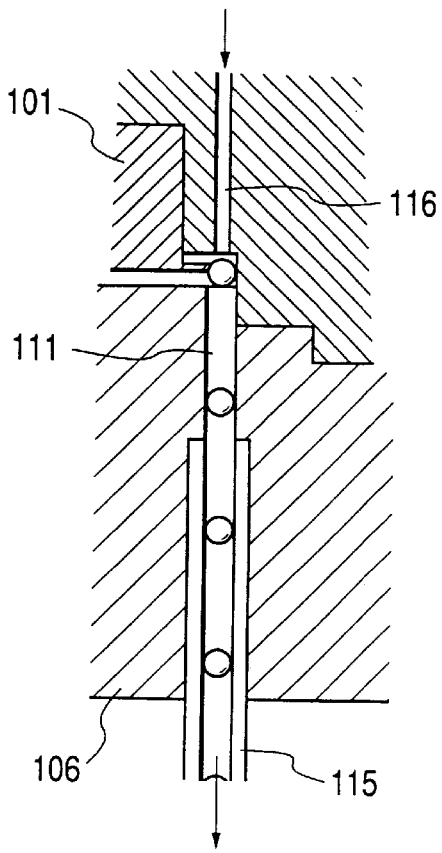
FIG. 16 is an enlarged cross sectional view of a portion C shown in FIG. 13.

FIG. 12 is a front view showing an apparatus for supplying spherical articles according to a fifth embodiment of the present invention in a state in which the cover portion has been removed. FIG. 13 is a cross sectional view taken along line D—D shown in FIG. 12. FIG. 14 is an enlarged view of the portion A shown in FIG. 12. FIGS. 15 and 16 are enlarged cross sectional views of the portions B and C shown in FIG. 13, respectively.

Referring to FIG. 12, reference numeral 101 represents a rotative rotation relay 101 formed into a disc shape. Stepped portion are formed in the outer periphery of the rotation relay 101 so that outer stepped-portions 101a are formed. As shown in FIG. 14, a plurality of accommodating portions 102 for accommodating the spherical semiconductor devices 103 are formed on the outer surface of the outer stepped-portion 101a in the direction of the circumference of the rotation relay 101. As shown in FIG. 14(a), the accommodating portion 102 may be formed into a semicylindrical shape having a semicircular cross sectional shape opened on the outer surface of the outer stepped-portion 101a. As shown in FIG. 14(b), the accommodating portion 2 may be formed into a cylindrical shape having a circular cross section, the accommodating portion 102 being formed at a position deviated for a predetermined distance from the outer surface of the outer stepped-portion 101a toward the center of the rotation relay 101. The accommodating portion 102 has a space which is capable of accommodating each semiconductor device 103. When the height of the outer stepped-portion 101a is adjusted, a plurality of the semiconductor devices 103 can be accommodated in the accommodating chamber.

The rotation relay 101 is rotatively supported in the support container 104, as shown in FIG. 13. The support container 104 has a separated structure composed of a container portion 105 serving as a housing for the rotation relay 101 and a cover portion 106 serving as a cover for the container portion 105.

The container portion 105 has a recess 107 which accommodates the rotation relay 101 and to which the cover portion 106 is engaged. A bearing 109 for rotatively supporting a rotational shaft 108 integrally formed with the rotation relay 101 is provided for the container portion 105. A receiving pipe 110 for receiving the semiconductor devices 103 supplied by the conveying atmosphere flow from a previous process (not shown) is disposed at a predetermined position on the outer surface of the container portion 105. In this embodiment, the semiconductor devices 103 are supplied from the previous process by dint of the air flows.

The receiving pipe 110 is arranged to supply the semiconductor device 103 to the accommodating chamber 102 of the rotation relay 101. The leading end of the receiving pipe 110 is connected to an end of a receiving passage 112 penetrating the container portion 105 and having a diameter similar to that of the accommodating chamber 102 so as to be integrally formed with the receiving passage 112. Another end of the receiving passage 102 is opened at a position facing the accommodating chamber 102 provided for the outer stepped-portion 101a. Thus, the semiconductor devices 103 can be introduced into the accommodating chamber 102 through the receiving passage 112.

When the semiconductor device 103 is introduced into the accommodating chamber 102 from the receiving passage 112, the receiving passage 112 may be brought to a position above the accommodating chamber 102 so as to use natural dropping of the semiconductor devices 103 by dint of the gravity. To reliably and quickly accommodate the semiconductor devices 103 in the accommodating chamber, it is preferable that an accommodating mechanism arranged to use sucking force as follows is employed.

That is, this embodiment has a structure arranged as shown in FIG. 15 such that a suction passage 113 is formed on an extension of the axis line of the receiving passage 112, the suction passage 113 being formed in the cover portion 106 at a position interposing the accommodating chamber 102. An end of the suction passage 113 is opened toward the accommodating chamber 102. Another end of the suction passage 113 is connected to a suction pipe 114 connected to a vacuum suction unit (not shown). When the vacuum suction unit has been operated, the atmosphere is sucked through the suction passage 113. The sucking force is caused to act on the accommodating chamber 102 and the receiving passage 112. Note that undesirable introduction of the semiconductor device 103 into the suction passage 113 is prevented by making the diameter of the suction passage 113 to be slightly larger than that of the semiconductor device 103. If necessary, the suction passage 113 may be provided with a filter for removing small dust which is contained in the atmosphere adjacent to the semiconductor device 103.

As shown in FIG. 13, this embodiment has a structure that a discharge passage 111 for discharging the semiconductor device 103 from the accommodating chamber 102 is provided for the cover portion 106 at a position symmetrical to the position at which the suction passage 113 is formed. An end of the discharge passage 111 is opened in the accommodating portion 102. A delivery pipe 115 for conveying the semiconductor device 103 to a next process (not shown) is connected to another end of the discharge passage 111. Note that the diameter of the discharge passage 111 is made to be the same or slightly larger than the diameter of the accommodating chamber 102 in order to smoothly convey the semiconductor device 103 to the discharge passage 111.

When the semiconductor device 103 is discharged from the accommodating chamber 102 through the discharge passage 111, the discharge passage 111 may be disposed below the accommodating chamber 102 to use natural dropping of the semiconductor device 103 by dint of the gravity. To reliably and quickly discharge the semiconductor device 103 from the accommodating chamber, it is preferably that a discharge mechanism is employed which uses jetting force of high-pressure fluid as follows.

That is, this embodiment has a structure that a discharge passage 116 is formed in the container portion 105 at a position on an extension of the axial line of the discharge passage 111 and interposing the accommodating chamber 102. An end of the discharge passage 116 is formed toward the accommodating chamber 102. Another end of the discharge passage 116 is connected to a jetting pipe 117 connected to a fluid supply apparatus (not shown). The jetting force of the high-pressure fluid supplied because of the operation of the fluid supply apparatus is caused to act on the accommodating chamber 102 and the discharge passage 111 through the discharge passage 116. To raise the jetting pressure of the high-pressure fluid and to prevent undersirable introduction of the semiconductor device 103 into the discharge passage 116, the diameter of the discharge passage 116 is made to be smaller than that of the semiconductor device 103. In this embodiment, a high-pressure air supply apparatus is employed to serve as the fluid supply apparatus.

The receiving passage 112 or the discharge passage 111 may be provided with a position detection means for confirming existence of the single crystal silicon 3. The position detection means may be a sensor comprising optical fiber sensors disposed to face each other while interposing each passage. Another known sensor may be employed. When the position detection means is provided as described above, the periodical supply of the semiconductor devices 3 can be confirmed.

The cover portion 106 is hermetically joined to the container portion 105. The outer surface of the rotation relay 101 is slidable on the inner surface of the recess 107 of the container portion 105 in a state in which the outer surface is in close contact with the inner surface. The material of rotation relay 101 and the cover portion 106 may be resin, stainless steel or a material obtained by coating stainless steel with teflon resin to be suitable for the atmosphere, for example, water and inert gases, through which the semiconductor device 103 is conveyed.

The support container 104 is joined to a drive-shaft holder 119 through a flange 118. A drive shaft 120 penetrates the drive-shaft holder 119 so as to be accommodated in the holder. The drive shaft 120 is, through a joint 121, connected to the rotational shaft 108 of the rotation relay 101. Rotating force of a motor 123 is transmitted to the drive shaft 120 through a drive-force transmitting mechanism 122, the detailed description of which is omitted.

The apparatus for supplying spherical articles according to the present invention comprises an accelerator 124 disposed at a position apart from the support container 104 for a predetermined distance. The accelerator 124 includes an accelerating pipe 125. An end of the accelerating pipe 125 is connected to the delivery pipe 115 extending from the support container 104, while another end of the same is connected to a conveying pipe 127 extending to a next process.

A branched pipe 125*a* is branched from a predetermined position of the accelerating pipe 125 in the accelerator 124 at a branching angle θ. The branched pipe 125*a* is connected to a fluid supply pipe 126 connected to a fluid supply apparatus (not shown) so that supply of high-pressure fluid to the inside portion of the accelerating pipe 125 is permitted. The branching angle θ must be an acute angle. To prevent a back-flow of the high-pressure fluid supplied from the branched pipe 125*a* to the delivery pipe 115, it is preferable that the branching angle is 45 degrees or smaller, more preferably 30 degrees or smaller. Note that the fluid supply apparatus may be as well as the above-mentioned fluid supply apparatus for supplying high-pressure fluid to the jetting pipe 117. The two apparatuses may be provided as individual apparatuses. In this embodiment, high-pressure air is employed as the high-pressure fluid.

In this embodiment, the delivery pipe 115, the accelerating pipe 125 and the conveying pipe 127 are connected sequentially to form a straight line. Therefore, the semiconductor device 103 are supplied from the delivery pipe 115 of the support container 104 to a next process (not shown) without a necessity of changing the direction. Note that the jetting pipe 117 may be disposed on an extension of the branched pipe 125*a*. In this case, the direction of the high-pressure fluid, that is, high-pressure fluid air, which is supplied from the branched pipe 125*a*, is not changed. Therefore, the semiconductor device 103 can be conveyed more quickly and farther.

The operation of the above-mentioned apparatus for supplying spherical articles will now be described.

The rotation relay 101 is rotated by the motor 123. A plurality of the spherical semiconductor devices 103 processed in the previous process (not shown) are irregularly supplied form the receiving pipe 110 to the rotation relay 101. It is preferable that the semiconductor devices 103 are supplied by the method using the conveying force generated by high speed air. However, the supply means is not limited particularly.

Since the supply speed of the semiconductor devices 103 is significantly high in general, the supply speed of the semiconductor devices 103 to the receiving pipe 110 is higher than the accommodating speed of the semiconductor devices 103 into the accommodating chamber 102. Therefore, the semiconductor devices 103 in the receiving pipe 110 are deposited at a position opposite to the outer stepped-portion 101a of the rotation relay 101 in such a manner that the semiconductor devices 103 are successively disposed as shown in FIG. 15.

Note that the suction force is acting from the suction pipe 114 by dint of the operation of the suction unit (not shown). The suction force reaches the position of the outer stepped-portion 101a through the suction passage 113.

When the rotation of the rotation relay 101 has caused the position of the accommodating chamber 102 to coincide with the positions of the receiving passage 112 and the suction passage 113 in the above-mentioned state, the suction force from the suction passage 113 reaches the receiving passage 112 through the accommodating chamber 2. Therefore, the semiconductor devices 103 in the state in which they are deposited in the receiving passage 112 are sucked into the accommodating chamber 102. Since each of the accommodating chambers 102 has a capacity for receiving one semiconductor device and introduction into the suction passage 113 is inhibited, the semiconductor device 103 is accommodated in each of the accommodating chamber 102. Note that a shutter may be provided for an end of the opening portion of the receiving passage 112 so as to be closed after the semiconductor device 103 has been accommodated in the accommodating chamber 102. In this case, each of the semiconductor devices 103 can reliably be accommodated in each of the accommodating chamber 102. Moreover, abrasion of the surface of the semiconductor device 103 can be prevented which takes place when the rotation relay 101 is rotated and which is caused from the contact and friction between the semiconductor device 103 accommodated in the accommodating chamber 102 and the semiconductor device 103 in the receiving passage 112 in a waiting state.

The rotational speed of the rotation relay 101 determines the speed at which the semiconductor devices 103 are accommodated in the accommodating chambers 102. In general, the foregoing rotational speed is determined in such a manner that undesirable deposition of a large quantity of the semiconductor devices 103 in the receiving passage 112 can be prevented. If the rotational speed of the rotation relay 101 is excessively high, the speed at which the semiconductor devices 103 are accommodated in the accommodating chambers 102 exceeds the speed at which the semiconductor devices 103 are supplied. In this case, there is apprehension that the semiconductor devices 103 which must be accommodated in the accommodating chambers 102 become lost. Therefore, the rotational speed of the rotation relay 101 has an upper limit with which at least one or more semiconductor device 103 always exists in the receiving passage 112.

When the rotation relay 101 is rotated, the semiconductor devices 103 are, in a state in which the semiconductor devices 103 are held in the accommodating chambers 102, moved along the circumference of the rotation relay 101 by dint of the foregoing rotation.

When the position of the accommodating chamber 102 has been made coincide with the positions of the discharge passage 111 and the discharge passage 116, high-pressure fluid air supplied from the fluid supply apparatus (not shown) is jetted into the accommodating chamber 102 through the jetting pipe 117 and the discharge passage 116. The jetting force of air causes the semiconductor device 103 in the accommodating chamber 102 to be delivered to the discharge passage 111, and then supplied to a next process through the delivery pipe 115.

Since this embodiment has the structure that the accelerator 124 is disposed on the extension of the delivery pipe 115, the semiconductor device 103 allowed to reach the accelerating pipe 125 in the support container 104 through the delivery pipe 115 is furthermore accelerated by high-pressure fluid air supplied from the fluid supply apparatus (not shown) through the fluid supply pipe 126 and the branched pipe 125a. Then, the semiconductor device 103 is conveyed to the conveying pipe 127. Therefore, the semiconductor device 103 can be conveyed to a next process at higher speed.

According to the present invention, the following effect can be obtained.

(1) Since the spherical articles, such as spherical semiconductor devices, are separated from one another, the spherical articles can periodically be supplied to a next process at predetermined intervals. Therefore, a process for the spherical articles can be performed in the next step in such a manner that a predetermined quality can be maintained.

(2) Since the spherical articles, such as spherical semiconductor devices, are separated from one another by sucking and jetting fluid, such as air, the spherical articles can reliably be handled.

(3) Since the spherical articles, such as the spherical semiconductor devices, are moved by high speed fluid under pressure, the spherical articles can be conveyed at high speed.

(4) The process for converting the atmosphere of the previous process through which spherical articles are conveyed can be performed at high speed and significantly improved productivity can be realized.

(5) A satisfactory sealing characteristic can be realized with which introduction of the atmosphere through which spherical articles are conveyed from a previous process can reliably be prevented.

(6) Since the state in which spherical articles are conveyed can reliably be recognized thanks to the provided position detection means, serial numbers can be given to the spherical articles. Thus, the process control can appropriately be performed.

(7) Since each spherical article can reliably be conveyed, clogging which occurs during conveyance can be prevented.

(8) Since any trouble occurring during conveyance can immediately be detected, the processes can be formed into stable and continuous processes.

(9) The required quantity of the medium for forming the atmosphere can be minimized, energy and resources can be saved and the cost can be reduced.

(10) Since the flow of the medium for forming the atmosphere can be minimized, the characteristics for sealing the atmospheres among the processes can be improved.

What is claimed is:

1. An apparatus for conveying spherical articles comprising:
    a rotary relay having a plurality of accommodating chambers for accommodating spherical-articles, said accommodating chambers formed at spaced intervals; and
    a support container arranged to support said rotary relay and having a spherical-article receiving passage and a discharge passage arranged to communicate with said accommodating chambers, so that each said accommodating chamber and one of said spherical-article receiving passage and said discharge passage are in a substantially straight line.

2. An apparatus for conveying spherical articles comprising:

a rotary relay having a plurality of accommodating chambers for accommodating spherical-articles, said accommodating chambers formed at spaced intervals;

a support container arranged to support said rotary relay and having a spherical-article receiving passage and a discharge passage arranged to communicate with said accommodating chambers;

a suction passage arranged to communicate with said accommodating chamber;

a vacuum suction unit for sucking the atmosphere through said suction passage;

a fluid discharge passage arranged to communicate with said accommodating chambers; and a fluid supply unit for supplying fluid under pressure into said fluid discharge passage, said fluid supply unit configured to supply a fluid different from the atmosphere sucked through said suction passage.

3. An apparatus for conveying spherical articles comprising:

a rotary relay having a plurality of accommodating chambers for accommodating spherical-articles, said accommodating chambers formed at spaced intervals;

a support container arranged to support said rotary relay and having a spherical-article receiving passage and a discharge passage arranged to communicate with said accommodating chambers;

an acceleration pipe connected to said discharge passage;

a branched pipe branched from said acceleration pipe; and a fluid supply unit for introducing fluid under pressure into said branched pipe, wherein an accelerating unit is provided which furthermore accelerates spherical articles by the fluid under pressure jetted into said acceleration pipe through said branched pipe.

4. An apparatus for conveying spherical articles comprising:

a rotative rotary relay having a plurality of accommodating chambers for accommodating spherical articles, said accommodating chambers formed on a same circumference at spaced intervals;

a support container mounted in close contact with said rotary relay and having a spherical article receiving passage and a discharge passage;

an atmosphere discharge pipe disposed in such a manner as to communicate with said accommodating chambers of said rotary relay; and an atmosphere supply pipe disposed on a spherical article discharge side of said rotary relay in such a manner as to communicate with said accommodating chamber and configured to supply a fluid under pressure into said discharge passage, said atmosphere supply pipe configured to supply a fluid different from an atmosphere sucked through said atmosphere discharge pipe.

5. The apparatus for conveying spherical articles according to claim 4, where said rotary relay has an annular portion, and each said accommodating chamber has an accommodating portion formed in the outer periphery of said annular portion in such a manner as to be enabled to communicate with said receiving passage and said discharge passage of said support container and as to have a diameter larger than that of the spherical article, and a through passage allowed to communicate with said accommodating portion, disposed in a direction radially of said annular portion and having a diameter smaller than that of said accommodating chamber.

6. The apparatus for conveying spherical articles according to claim 5, wherein said through passage is formed in such a manner as to be enabled to communicate with said atmosphere discharge pipe and said atmosphere supply pipe on the inner surface of said annular portion.

7. The apparatus for conveying spherical articles according to claim 6, wherein said receiving passage and said atmosphere discharge pipe are formed in such a manner as to be able to face each other through said through passage and to be on a same line.

8. The apparatus for conveying spherical articles according to claim 6, wherein said discharge passage and said atmosphere supply pipe are formed in such a manner as to be able to face each other through said through passage and to be on a same line.

9. The apparatus for conveying spherical articles according to claim 5, wherein said receiving passage of said support container is configured in such a manner as to be closed by a next spherical article at the instant when one of the spherical articles is supplied to said accommodating portion, said atmosphere discharge pipe is allowed to communicate with said through passage at the same instant so as to discharge the atmosphere in said through passage, and the pressure in said accommodating portion is instantaneously made to be a negative pressure.

10. An apparatus for conveying spherical articles according to claim 9, further comprising:

a second atmosphere converting portion formed between said receiving passage and said discharge passage of said support container, wherein said second atmosphere converting portion has a second atmosphere discharge pipe and a second atmosphere supply pipe each of which is formed along the surface of said annular member.

11. The apparatus for conveying spherical articles according to claim 8, wherein when said atmosphere supply pipe has been allowed to communicate with said through passage and thus the atmosphere has been supplied into said through passage, the pressure in said accommodating portion is instantaneously made to be a negative pressure, causing discharge to said discharge passage to be performed by the atmospheric pressure from said through passage.

12. The apparatus for conveying spherical articles according to claim 4, further comprising at least one spherical article-position detector disposed in said receiving passage and said discharge passage.

13. The apparatus for conveying spherical articles according to claim 4, further comprising opening/closing valves each of which is provided for said atmosphere supply pipe and said atmosphere discharge pipe and each of which adjusts the flow rate of the conveying atmosphere; and at least one controller that controls opening/closing of said opening/closing valves in response to position confirmation signals supplied from said position detector.

14. The apparatus for conveying spherical articles according to claim 4, wherein at least one pair of a gas supply pipe and a gas discharge pipe is disposed between said receiving passage and said discharge passage in such a manner as to be enabled to communicate with said accommodating portion.

15. The apparatus for conveying spherical articles according to claim 14, wherein an inert gas, the temperature of which has been controlled to a required temperature, is supplied to said gas supply pipe.

16. The apparatus for conveying spherical articles, according to claim 14, wherein said gas supply pipe supplies an inert gas controlled to have a predetermined temperature.

17. The apparatus for conveying spherical articles according to claim 14, wherein said apparatus has two or more pairs of the gas supply pipe and the gas discharge pipe, and the gas which is supplied to each gas supply pipe is controlled to have different temperatures.

18. The apparatus for conveying spherical articles according to claim 17, wherein said apparatus has a first gas supply pipe and a first gas discharge pipe disposed upstream and a second gas supply pipe and a second gas discharge pipe disposed downstream, said first gas supply pipe is supplied with a gas containing nitrogen and controlled to a nitriding temperature, said second gas supply pipe is supplied with a gas, the temperature of which is room temperature, and when said accommodating chamber is at the position of said first gas supply pipe, said accommodating chamber serves as a nitriding chamber for performing nitrogen annealing, and when said accommodating chamber is at the second gas supply pipe, said accommodating chamber serves as a temperature adjusting chamber.

19. The apparatus for conveying spherical articles according to claim 14, wherein said apparatus has two or more pairs of the gas supply pipe and the gas discharge pipe, and the gases which are supplied to the gas supply pipes are gases having different compositions.

20. The apparatus for conveying spherical articles according to claim 14, wherein said discharge passage has a closing device that closes said accommodating chamber, and when the spherical article has reached the position of said discharge passage, the spherical article is not discharged and allowed to pass the position so that the spherical article in said accommodating chamber is able to rotate plural times before the spherical article is discharged.

* * * * *

UNITED STATES PATENT AND TRADEMARK OFFICE
CERTIFICATE OF CORRECTION

PATENT NO. : 6,102,629
DATED : August 15, 2000
INVENTOR(S) : M. Ishida et al.

It is certified that error appears in the above-identified patent and that said Letters Patent is hereby corrected as shown below:

Column 17,
Line 13 (claim 2, line 11), of the printed patent, "chamber" should be -- chambers --.
Line 61 (claim 5, line 2), of the printed patent, "where" should be -- wherein --.

Signed and Sealed this

Sixteenth Day of October, 2001

Attest:

*Nicholas P. Godici*

NICHOLAS P. GODICI
*Attesting Officer*    *Acting Director of the United States Patent and Trademark Office*